United States Patent
Mujcinovic

(10) Patent No.: US 10,383,253 B1
(45) Date of Patent: Aug. 13, 2019

(54) SEALABLE MULTI-SURFACE ELECTRONICS THERMAL CONDUCTION PACKAGE

(71) Applicant: NIO USA, Inc., San Jose, CA (US)

(72) Inventor: Nermin Mujcinovic, Fremont, CA (US)

(73) Assignee: NIO USA, Inc., San Jose, CA (US)

( * ) Notice: Subject to any disclaimer, the term of this patent is extended or adjusted under 35 U.S.C. 154(b) by 0 days.

(21) Appl. No.: 15/937,521

(22) Filed: Mar. 27, 2018

(51) Int. Cl.
| H05K 7/20 | (2006.01) |
| H05K 3/28 | (2006.01) |
| H05K 5/06 | (2006.01) |
| H01L 23/367 | (2006.01) |
| H05K 1/02 | (2006.01) |
| H05K 5/00 | (2006.01) |
| H05K 1/18 | (2006.01) |

(52) U.S. Cl.
CPC ......... *H05K 7/20409* (2013.01); *H05K 3/284* (2013.01); *H05K 5/0039* (2013.01); *H05K 5/064* (2013.01); *H05K 5/069* (2013.01); *H01L 23/3675* (2013.01); *H05K 1/0203* (2013.01); *H05K 1/181* (2013.01); *H05K 1/182* (2013.01); *H05K 7/2049* (2013.01); *H05K 2201/10545* (2013.01); *H05K 2203/1316* (2013.01); *H05K 2203/1327* (2013.01)

(58) Field of Classification Search
CPC . H05K 7/2039–20409; H05K 7/20436; H05K 7/20454; H05K 7/2049; H05K 5/0039; H05K 5/064; H05K 5/069; H05K 1/0203; H01L 23/36; H01L 23/3675
USPC ............... 361/714, 719–720; 165/80.1–80.3; 257/712–713, 722; 174/548, 378
See application file for complete search history.

(56) References Cited

U.S. PATENT DOCUMENTS

| 4,771,365 | A | | 9/1988 | Cichocki et al. |
| 5,319,522 | A | * | 6/1994 | Mehta ............... B29C 45/14639 174/521 |
| 5,739,463 | A | * | 4/1998 | Diaz .................... H05K 5/0039 174/378 |
| 5,999,416 | A | | 12/1999 | McAnally et al. |
| 6,134,121 | A | * | 10/2000 | Braxton .............. H04M 1/0277 361/818 |
| 6,583,986 | B1 | | 6/2003 | Storti et al. |
| 7,675,167 | B2 | | 3/2010 | Schlomann |
| 7,894,185 | B2 | | 2/2011 | Weber et al. |

(Continued)

OTHER PUBLICATIONS

U.S. Appl. No. 15/937,546, filed Mar. 27, 2018, Mujcinovic.

(Continued)

*Primary Examiner* — Zachary Pape
(74) *Attorney, Agent, or Firm* — Sheridan Ross P.C.

(57) ABSTRACT

An electronics thermal conduction package is provided. The package may include a housing and an interior space, or envelope, configured to receive a printed circuit board assembly ("PCBA") with one or more microprocessors or other heat generating elements. The package can be elastically deformed to open a dimension of the envelope, or receiving cavity, such that a complete PCBA can be inserted inside the interior space of the package. Once inserted, the package may be returned to its undeformed, or substantially undeformed, state such that surfaces in the interior space of the package contact one or more of the heat generating elements on the PCBA creating a conductive thermal path from the heat generating elements to the housing of the package.

20 Claims, 9 Drawing Sheets

(56) References Cited

U.S. PATENT DOCUMENTS 9,209,107 B2 12/2015 Kuroda
2013/0021754 A1* 1/2013 Lu ..................... H05K 7/20445
361/714

OTHER PUBLICATIONS

Official Action for U.S. Appl. No. 15/937,546, dated Aug. 31, 2018 14 pages.
Notice of Allowance for U.S. Appl. No. 15/937,546, dated Feb. 14, 2019 7 pages.

* cited by examiner

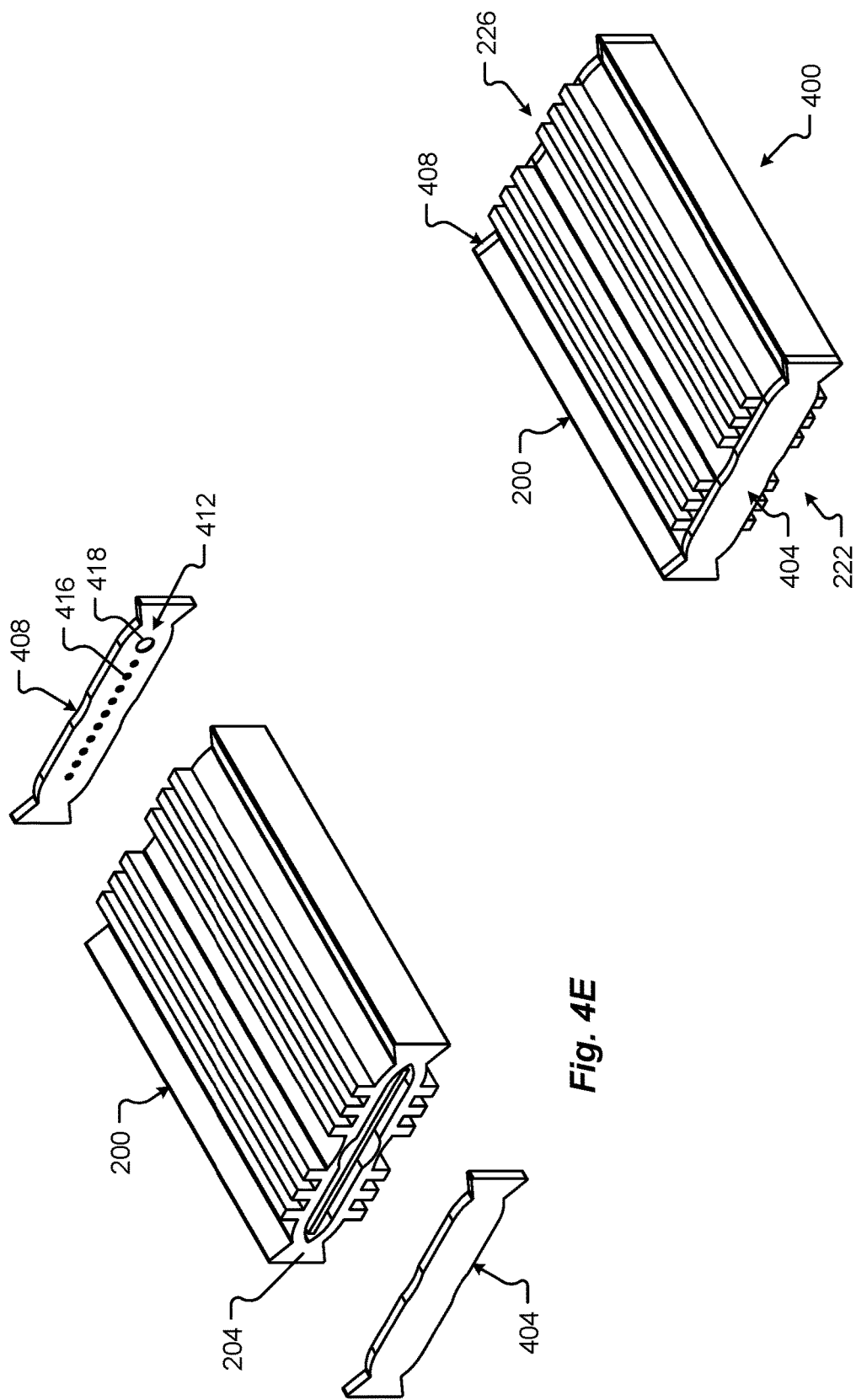

SEALABLE MULTI-SURFACE ELECTRONICS THERMAL CONDUCTION PACKAGE

FIELD

The present disclosure is generally directed to electronics packaging, in particular, toward environmentally-sealed thermally-controlled packages for electronic component assemblies.

BACKGROUND

Most electronic devices generate heat while in use. This heat is typically generated by the flow of electric current through one or more resistive elements and/or components in the electronic device. When the heat generated by these elements and/or components is not efficiently removed, the temperatures of an electronic device can exceed a normal operating range. Operating electronics at temperatures outside of the normal operating range, even periodically, can cause premature failures and result in shorter component life spans.

The efficient thermal management of electronic components and devices generally requires one or more active and/or passive cooling elements. For example, typical microprocessors may generate heat that can be removed or dissipated via an attached heat sink and/or some other cooling element/system, such as a fan, directed cooled air, fluid cooling, etc. In this example, the heat generated may be routed to, and/or dissipated, into an environment immediately surrounding the microprocessors.

However, the options for removing heat from an electronic device within a sealed environment (e.g., hermetic package, pseudo-hermetic package, sealed enclosure, etc.) may be limited to those approaches employing costly, sizable, and/or complex cooling systems.

BRIEF DESCRIPTION OF THE DRAWINGS

FIG. 4E shows a perspective view of a fifth assembly state of the sealable multi-surface electronics thermal conduction package and electronics in accordance with embodiments of the present disclosure;

FIG. 4F shows a perspective view of a sixth assembly state of the sealable multi-surface electronics thermal conduction package and electronics in accordance with embodiments of the present disclosure;

DETAILED DESCRIPTION

Figure 1A:
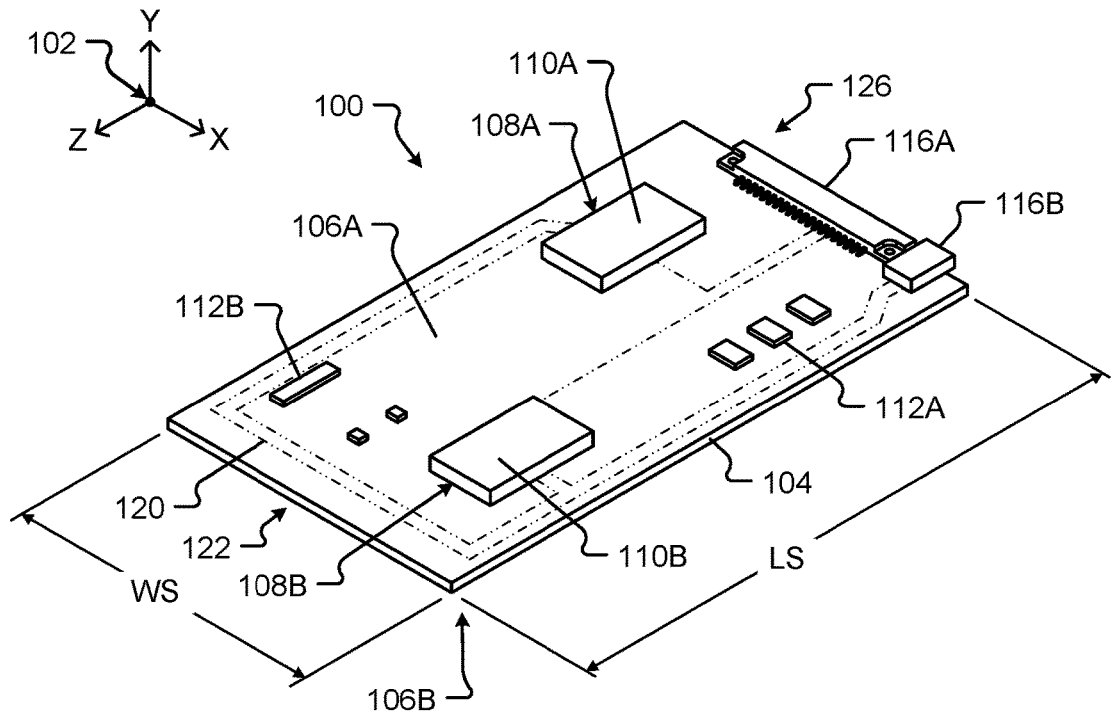
FIG. 1A shows a top perspective view of a printed circuit board assembly in accordance with embodiments of the present disclosure.

Embodiments of the present disclosure will be described in connection with electronics packaging, and in some embodiments, the construction, structure, and arrangement of elements making up a sealable multi-surface electronics thermal conduction package.

In some embodiments, the present disclosure describes a compact thermal conduction package configured to conductively cool multiple surfaces of electronics sealed inside a package. The package may include a housing and an interior space, or envelope, configured to receive a printed circuit board assembly ("PCBA") with one or more microprocessors and/or other heat generating elements. In one embodiment, the PCBA may include microprocessors disposed on opposing planar faces of the printed circuit board (PCB) or substrate. In general, the present disclosure provides a package that can be elastically deformed to open a dimension of the envelope, or receiving cavity, such that a complete PCBA can be inserted inside the interior space of the package. Once inserted, the package may be returned to its undeformed, or substantially undeformed, state such that surfaces in the interior space of the package contact one or more of the heat generating elements on the PCBA creating a conductive thermal path from the heat generating elements to the housing of the package.

In some embodiments, the package may include an extruded shape or housing. The housing may include a number of cooling fins, or heat sink surfaces, disposed on an outside of the housing, at least one pressure contact area, and an interior space/receiving cavity and/or PCB envelope configured to receive a PCBA and/or other electronics.

As described herein, the housing of the package may include a weakened, controlled cross-sectional area, or flexure, configured to elastically bend, or deform, when a force is applied to one or more of the ends having the pressure contact area. For example, as force, F is applied to the ends of the package, an internal height dimension, HC, may be increased from a first height dimension, HC, to a second increased height dimension, (HC+Y), where Y is a non-zero distance, creating an expanded space to receive a PCBA and/or other electronics.

Although described herein as compressive, or squeezing, forces, it should be appreciated, that only one force, F, need be applied to an end of the package while the opposing end is held in place. This containment of the package while a force, F, is applied effectively provides an equal and opposing force against the opposing end of the package. Further, the flexure area(s) of the package may be designed to control the application of force such that the envelope is opened outwardly from the center and not collapsed toward the interior space of the package.

Once compressed, and while maintaining the package in the opened state, a PCBA or other electronic device/system may be inserted into the elastically deformed opening of the package. After the PCBA is in place, the force, F, may be removed from the package and the package will attempt to return from the elastically deformed state having expanded internal height dimension (HC+Y) to the original undeformed state having internal height dimension HC. In some embodiments, the package may be dimensioned and toleranced such that the height of the PCBA components is equal to or slightly greater than the internal height dimension HC in the original undeformed state. This dimensioning may provide a vertical clamping force on the components of the PCBA when the compressive, or opening, force is removed. Among other things, this clamping force may hold the PCBA inside the package and in direct conductive thermal communication with the housing. The heat generating elements of the PCBA may be in contact with the housing at one or more conduction cooling contact areas.

Heat generated from the PCBA inside the package may be passed through the housing to the cooling fins disposed on the outside of the housing walls. In some embodiments, a thermal interface material may be disposed between the heat generating elements on the PCBA and the conduction cooling contact areas prior to clamping the PCBA in place inside the package.

In some embodiments, the package may be sealed via one or more soldered, brazed, welded, and/or otherwise affixed endplates. The endplates may include one or more connectors to the PCBA and/or provide an electrical interconnection to the PCBA from the outside of the package. In some cases, these electrical connectors and/or electrical interconnections may be hermetically sealed, potted, and/or pseudo-hermetically sealed within the endplates.

As can be appreciated, the compact package described herein can provide efficient cooling of multi-surface electronics equipment in a hermetic and/or sealed environment. Further, due in part to the small size and passive cooling structure, the device is capable of being installed in any environment or area of a vehicle, machine, system, etc.

In some embodiments, the package may employ a multiple-flexure system in the extruded housing such that an elastic opening force may provide a linear translation (e.g., in the vertical direction) of one or more cooling contact surfaces of the housing. As the opening force is applied to the pressure contact area, the force displaces the angled flexures outwardly from the center of the package. This displacement results in a linear translation of each of the cooling contact surfaces creating a more even clamping pressure on the PCBA elements when the opening force is removed. It is an aspect of the present disclosure that the flexures may be sized and/or tuned to provide a desired clamping force against the one or more components of the PCBA.

Figure 1B:
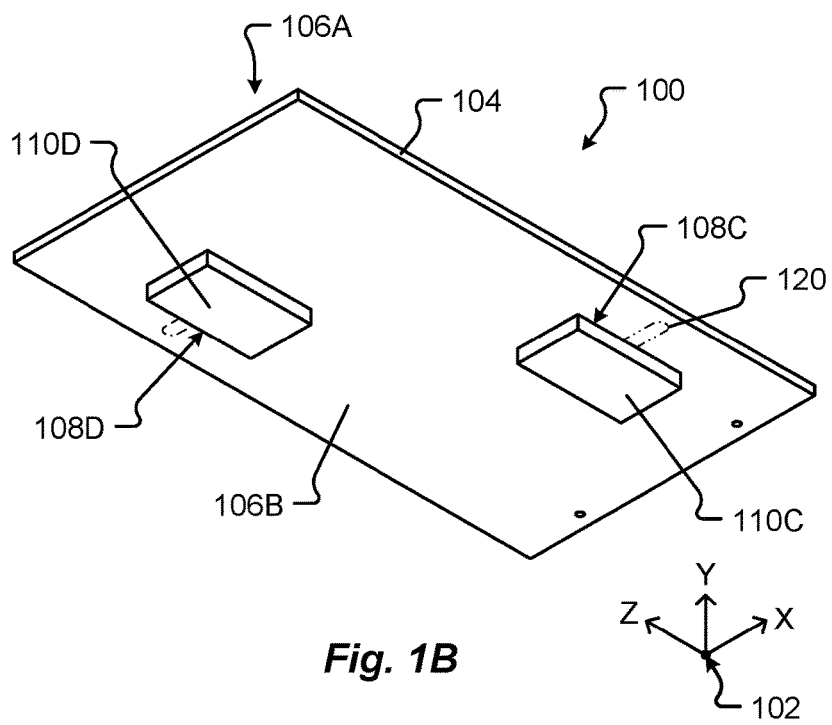
FIG. 1B shows a bottom perspective view of the printed circuit board assembly of FIG. 1A.
Figure 1C:
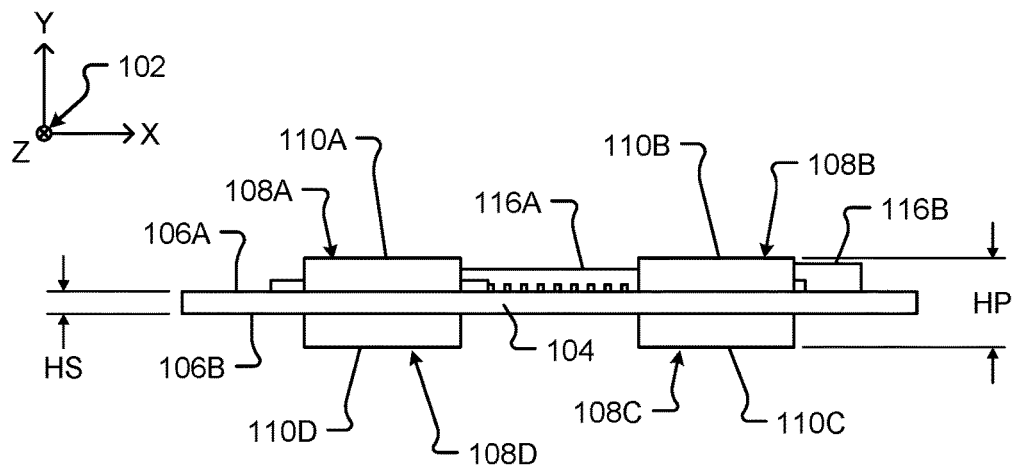
FIG. 1C shows a front elevation view of the printed circuit board assembly of FIGS. 1A and 1B.

Referring to FIGS. 1A-1C, various views of a printed circuit board assembly (PCBA) 100 are shown in accordance with embodiments of the present disclosure. In some embodiments, the features of the PCBA 100 may be described with reference to one or more axes (e.g., X-axis, Y-axis, Z-axis), or planes (e.g., XZ-plane, XY-plane, YZ-plane) of the coordinate system 102 shown. As shown, the PCBA 100 may include a substantially planar substrate 104 having a length, LS, running from a first end 122 to a second end 126 of the substrate 104. This length, LS, and a width, WS, of the substrate 104 may define at least one substantially planar component mounting surface 106A, 106B disposed on the first side and/or second side of the substrate 104. The first surface 106A of the substrate 104 may be separated from the second surface 106B of the substrate 104 by a thickness, or height, HS, corresponding to one or more layers of material making up the substrate 104. In some embodiments, the length, LS, and width, WS, of the substrate 104 may correspond to the overall length and width of the PCBA 100. The height, HS, of the substrate 104, however, may differ from the height, HP, of the PCBA 100. For example, the height, HP, of the PCBA may include an overall height of the components attached, soldered, fused, and/or protruding from one or more surfaces 106A, 106B of the PCBA 100 in addition to the height, HS, of the substrate 100.

In some embodiments, the substrate 104 may correspond to a printed circuit board (PCB). In one embodiment, the substrate 104 may include one or more layers of dielectric material and at least one layer disposed thereon including electrically conductive traces 120 configured to electrically interconnect electronic components of the PCBA 100. The traces 120 may run from one or more legs, contacts, or pins associated with passive electronic components (e.g., resistors, capacitors, diodes, transformers, etc.) and/or active electronic components (e.g., transistors, processors, application specific integrated circuit (ASIC), microprocessors, and/or other components configured to actively control electron flow, etc.) to one or more other components, connectors, and/or ground features associated with the PCBA 100. In some embodiments, the traces 120 may pass from a first surface 106A or side of the PCBA 100 to a second surface 106B or side of the PCBA 100.

The substrate 104 may be made from rigid material configured to mechanically support the electronic components. Examples of the rigid materials may include, but are in no way limited to, fiberglass, linen, ceramic, glass, resin, epoxy, phenolic cotton paper, woven fiberglass cloth, glass and polyester, paper and epoxy, insulated metal, polymer, polyimide, polytetrafluoroethylene, etc., and/or combinations thereof. The electrically conductive traces 120 of the substrate 104 may be machined, stamped, cut, etched, deposited, and/or otherwise formed from a conductive material. Examples of conductive materials may include, but are in no way limited to, copper, silver, gold, aluminum, graphene, etc., and/or other metals. For clarity of description, a limited number of traces 120 are shown in FIGS. 1A-1C.

As shown in FIGS. 1A-1C, the PCBA 100 may include a number of heat generating elements 108A-D, including at least one surface 110A-D from which heat may be transferred and/or emitted. The heat generating elements 108A-D may correspond to passive or active electronic components. In one embodiment, the heat generating elements 108A-D may be microprocessors, processors, and/or integrated circuits. The heat generating elements 108A-B may be attached to a first surface 106A of the substrate 104 via surface mount and/or through-hole mount soldering and/or via at least one adhesive layer disposed between the heat generating elements 108A-B and the first surface 106A. Heat generating elements 108C-D may be attached to a second surface 106B of the substrate 104 via surface mount and/or through-hole mount soldering and/or via at least one adhesive layer disposed between the heat generating elements 108C-D and the second surface 106B. In some embodiments, the first surface 106A may be disposed opposite the second surface 106B, or vice versa, separated by a material or substrate thickness, HS.

In addition to one or more heat generating elements 108A-D, the PCBA 100 may include other electronic components 112A, 112B, connectors 116A, 116B, electrical contacts, and/or mechanical features. The connectors 116A, 116B may correspond to communications connectors, power connectors, and/or a combination of communications and power connectors. In some embodiments, the connectors 116A, 116B may be disposed at the same end 126 of the substrate 104 or PCBA 100. Among other things, locating the connectors 116A, 116B at the same end 126 of the PCBA 100 allows a single end of the package to house the mating connections and/or passthrough electrical interconnections from an interior of the sealed package to an exterior of the sealed package.

In some embodiments, the PCBA 100 may include a plurality of heat generating elements 108A-D disposed on one or more sides or surfaces 106A, 106B of the substrate 104. FIG. 1C shows first and second heat generating elements 108A, 108B disposed on the first surface 106A of the substrate, while third and fourth heat generating elements 108C, 108D are shown disposed on the second surface 106B of the substrate 104. As provided above, the overall height, HP, of the PCBA 100 may be measured between points of the PCBA 100 that are disposed furthest from the substrate 104 (e.g., extending outwardly along the Y-axis). For example, the heat generating elements 108A-D are the tallest electronic components attached to the first and second surfaces 106A, 106B, respectively, on either side of the substrate 104. In this example, the overall height, HP, of the PCBA 100 may be measured from the heat emitting surface 110B of the second heat generating element 108B to the heat emitting surface 110C of the third heat generating element 108C. The heat emitting surfaces 110A-D of the heat generating elements 108A-D may be substantially planar and/or substantially parallel to the first and/or second surfaces 106A, 106B of the substrate 104.

Figure 2A:
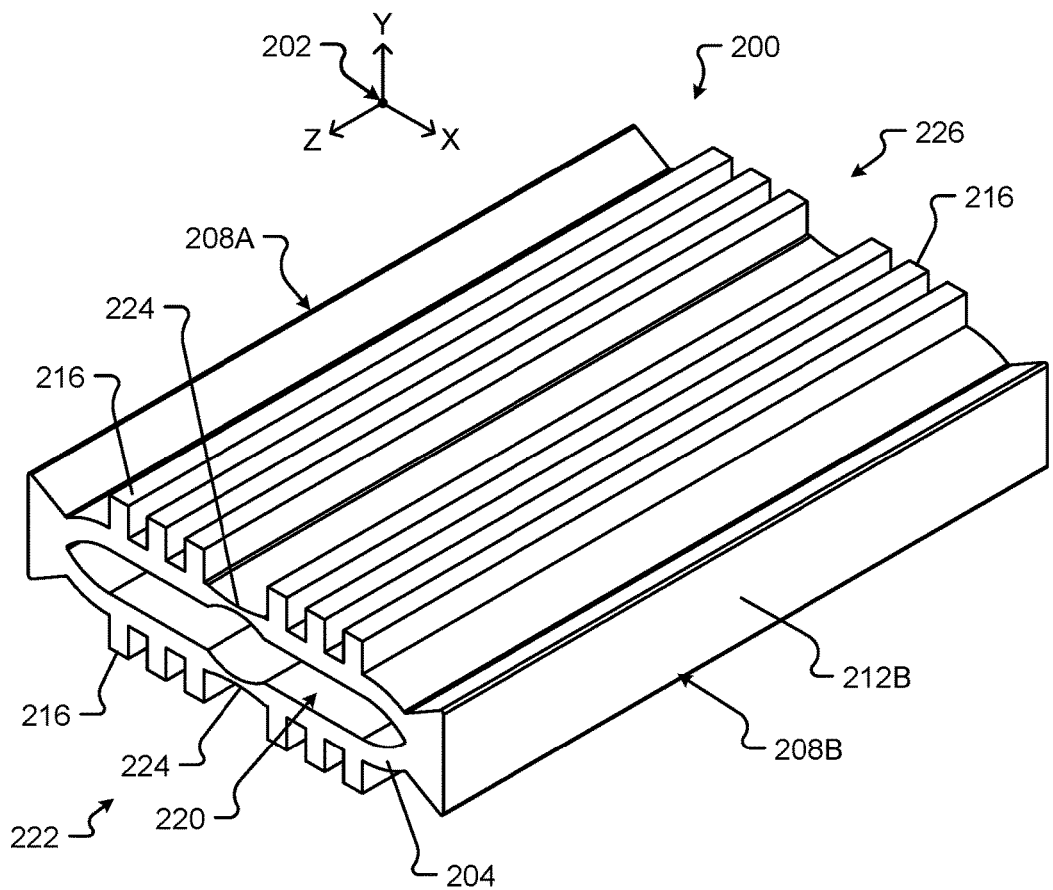
FIG. 2A shows a perspective view of a sealable multi-surface electronics thermal conduction package in accordance with embodiments of the present disclosure.

FIG. 2A shows a perspective view of a sealable multi-surface electronics thermal conduction package 200 in accordance with embodiments of the present disclosure. The package 200 may comprise a body including a profile, or extrusion, surface 204 and shape having a first end 208A, a second end 208B, a first contact surface 212A (not shown in FIG. 2A), a second contact surface 212B, and a hollow space, or electronics receiving cavity, 220 disposed therebetween. The package 200 may include a number of heat sink elements 216 configured to transfer thermal energy from a surface of the body to an environment surrounding the body. The heat sink elements 216 may be configured as straight fins, protrusions, pins, flared fins, etc., and/or combinations thereof. In some embodiments, the heat sink elements 216 may extend along a length of the package 200, for example, from the front 222 (e.g., at the profile surface 204) to the rear 226 of the package 200.

In some embodiments, the package 200 may include one or more controlled bend regions, areas, or flexures, 224. As shown in FIG. 2A, the package 200 includes flexures 224 disposed at an approximate center of the package 200, in both the upper and lower portions 206A, 206B of the profile surface 204. The flexures 224 may be shaped such that a force applied to the first and/or second contact surfaces 212A, 212B of the package 200 displaces the upper and lower portions 206A, 206B of the package 200 in a direction (e.g., the Y-axis direction) away from the center of the package 200.

The package 200 may be made from plastic, metal, carbon fiber, linen, composites, epoxy resin, etc., and/or combinations thereof. In one embodiment, the material of the package 200 may be thermally conductive. Thermally conductive material may provide a thermal path from an interior space 220 of the package 200 to an environment outside the package. This thermal path may serve as the path by which heat can be transferred from electronics contained inside the package 200. Examples of thermally conductive materials may include, but are in no way limited to, steel, titanium, aluminum, copper, tin, nickel, iron, etc., alloys thereof, and/or combinations thereof. The package 200 may be machined, formed, molded, cast, extruded, etc., and/or combinations thereof. In one embodiment, the material of the package 200 may be extrudable and thermally conductive. One example of an extrudable and thermally conductive material is aluminum. In any event, the package 200 may be designed such that the profile surface 204 defines a shape corresponding to at least one shape of an extrusion die used to create the package 200. In this example, the package 200 may be formed by heating and softening a billet of extrudable material (e.g., aluminum, etc.), forcing the billet of extrudable material through one or more extrusion dies (e.g., including the features, or inverse features, of the profile shape 204, etc.), cooling the extruded material as it exits the one or more extrusion dies, and then cutting the extruded material to length. Once extruded and cut to length, the body can be deburred, cleaned, machined, and/or finished (e.g., coated, anodized, nickel plated, etc.). The extruded body provides a cost-effective and integral, one-piece, housing for the sealable multi-surface electronics thermal conduction package 200.

Figure 2B:
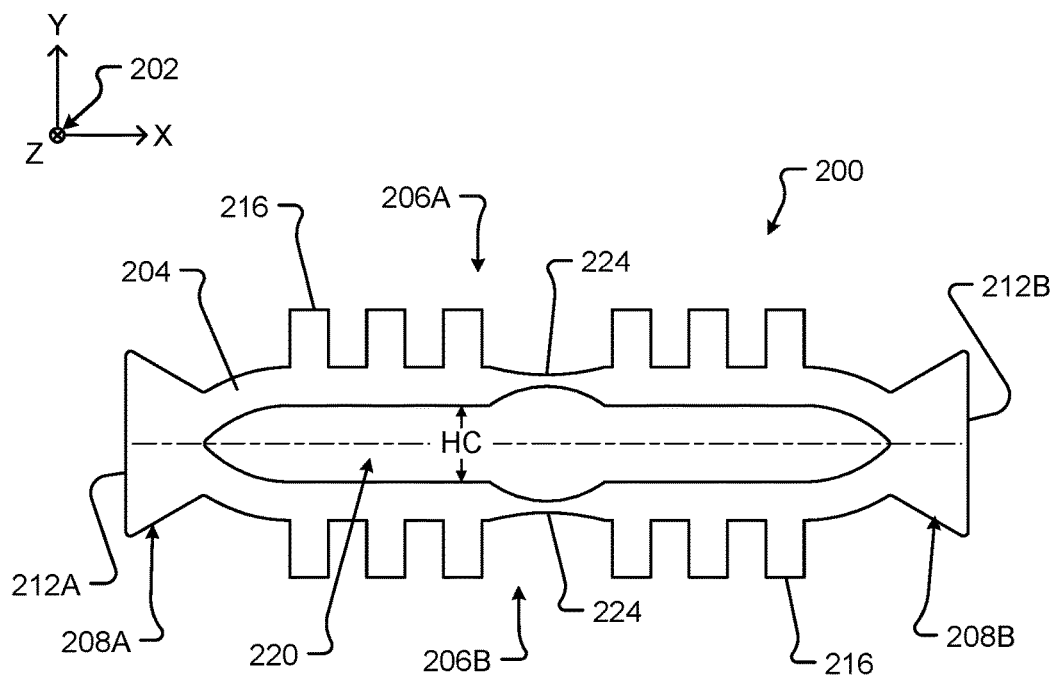
FIG. 2B shows a front elevation view of the sealable multi-surface electronics thermal conduction package of FIG. 2A in a first state in accordance with embodiments of the present disclosure.
Figure 2C:
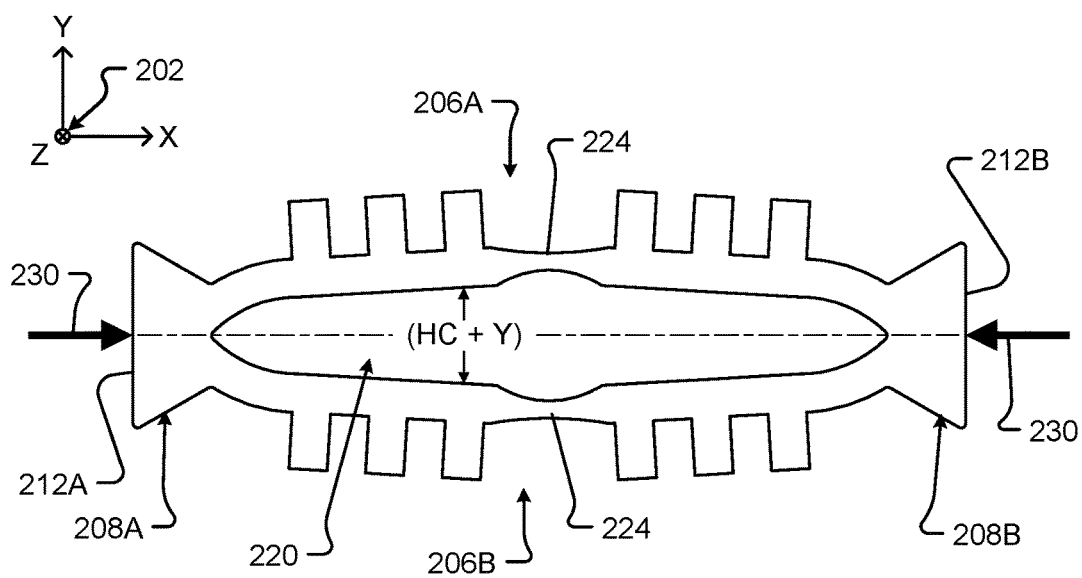
FIG. 2C shows a front elevation view of the sealable multi-surface electronics thermal conduction package of FIG. 2A in a second state in accordance with embodiments of the present disclosure.

FIGS. 2B and 2C shows front elevation views of the sealable multi-surface electronics thermal conduction package 200 of FIG. 2A in various assembly states in accordance with embodiments of the present disclosure. In particular, FIG. 2B shows the package 200 in a normal, uncompressed, or first state and FIG. 2C shows the package 200 in a compressed, or second state, where the force of compression causes the opening, or receiving cavity, 220 to open in the Y-axis direction. In some embodiments, the package 200 may be centerline symmetrical, for example, along a centerline running through the center of the package 200 along the X-axis and/or along a centerline running through the center of the package 200 along the Y-axis.

As shown in FIG. 2B, the package 200 in the first or normal state provides a receiving cavity 220, configured as a hollow space in the center of the package 200, having a cavity height, HC. The cavity height, HC, may be defined as a distance between a first interior surface of the package 200 and a second opposing interior surface of the package 200 along the Y-axis. This cavity height, HC, may remain substantially the same along the X-axis direction from a position adjacent to the first end 208A of the package 200 to a position adjacent to the second end 208B of the package 200. Additionally or alternatively, the cavity height, HC, may remain substantially the same along the length of the package (e.g., along the Z-axis direction). In some embodiments, the cavity height, HC, may be sized to substantially match an overall height, HP, of the PCBA 100 (see, e.g., FIG. 1C). In one embodiment, the cavity height, HC, may be undersized, or sized less than the overall height, HP, of the PCBA 100, by an amount to provide a clamping, or holding, force on any electronics (e.g., the PCBA 100, etc.) disposed inside the receiving cavity 220. In another embodiment, the cavity height, HC, may be oversized, or sized greater than the overall height, HP, of the PCBA 100, by an amount to allow a thermal interface material to be inserted between any inserted electronics (e.g., the PCBA 100, etc.) and the interior surfaces of the receiving cavity 220.

In FIG. 2C, the package 200 has been compressed (e.g., in the X-axis direction) by an applied force 230 such that the first end 208A and the second end 208B of the package 200 are displaced closer together toward the center of the package 200. In this second state, the width of the package 200 (e.g., the dimension from the first contact surface 212A to the second contact surface 212B) is less than the width of the package 200 in the first state. As the applied force 230 moves the first and second ends 208A, 208B closer together, the force 230 simultaneously moves the upper portion 206A and the lower portion 206B apart from one another (e.g., in a direction away from the center of the package 200 along the Y-axis). The displacement of the upper and lower portions 206A, 206B increases the cavity height, HC, by an opening distance, Y. As shown in FIG. 2C, the flexures 224 control the movement direction and displacement of the upper and lower portions 206A, 206B when the force 230 is applied and/or removed. In some embodiments, the increased cavity height, (HC+Y), may provide enough clearance inside the receiving cavity 220 to allow a PCBA 100, or other electronics, to be inserted therein. In some embodiments, the structure of the package 200 may prevent a PCBA 100 from being inserted into the receiving cavity 220 in the first state (e.g., because the cavity height, HC, may be substantially similar to, or less than, the overall height, HP, of the PCBA 100, etc.) and only allow insertion of the PCBA 100 when the package 200 is flexed, in the second state. Although shown as displacing angularly from the first and second ends 208A, 208B, (e.g., relative to the XZ-plane, etc.) it should be appreciated that the flexures 224 and/or structure of the profile shape 204 of the package 200 may be configured (e.g., adding more flexures, shaping each flexure, including a controlled pivot area, etc., and/or combinations thereof) to provide a linear, or substantially orthogonal, translation of the interior surfaces relative to the XZ-plane.

It is an aspect of the present disclosure that the package 200 may be elastically flexed from the first state (e.g., shown in FIG. 2B) to the second state (e.g., shown in FIG. 2C), and vice versa. For instance, the material of the package 200 and design of the flexures 224 may allow the package 200 to be repeatedly flexed within the elastic range of the package material. Additionally or alternatively, the package 200 may elastically return from the second state to the first state when the applied force 230 is removed from the package 200. This return from the second state to the first state may occur without the application of any external force (e.g., force applied to the package 200, etc.). For example, the elastic energy (e.g., potential mechanical energy) stored in the package 200 in the second state may be converted into kinetic energy substantially moving the package 200 back to the first state when the applied force 230 is removed from the package 200.

Figure 3A:
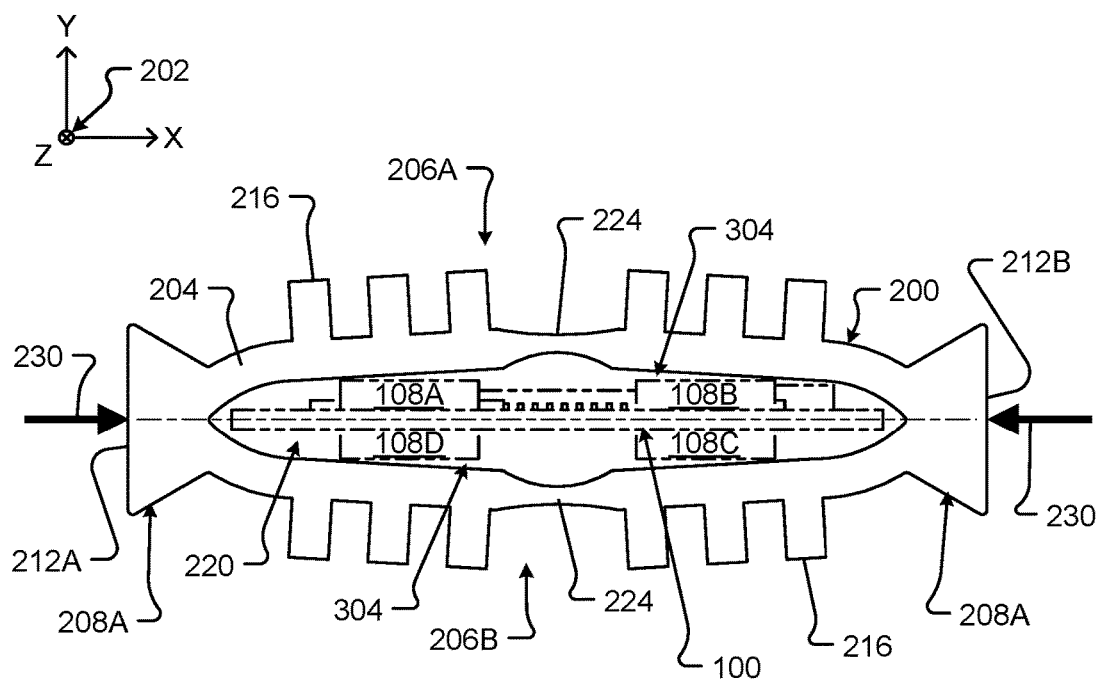
FIG. 3A shows a front elevation view of a sealable multi-surface electronics thermal conduction package and inserted electronics in accordance with embodiments of the present disclosure.
Figure 3B:
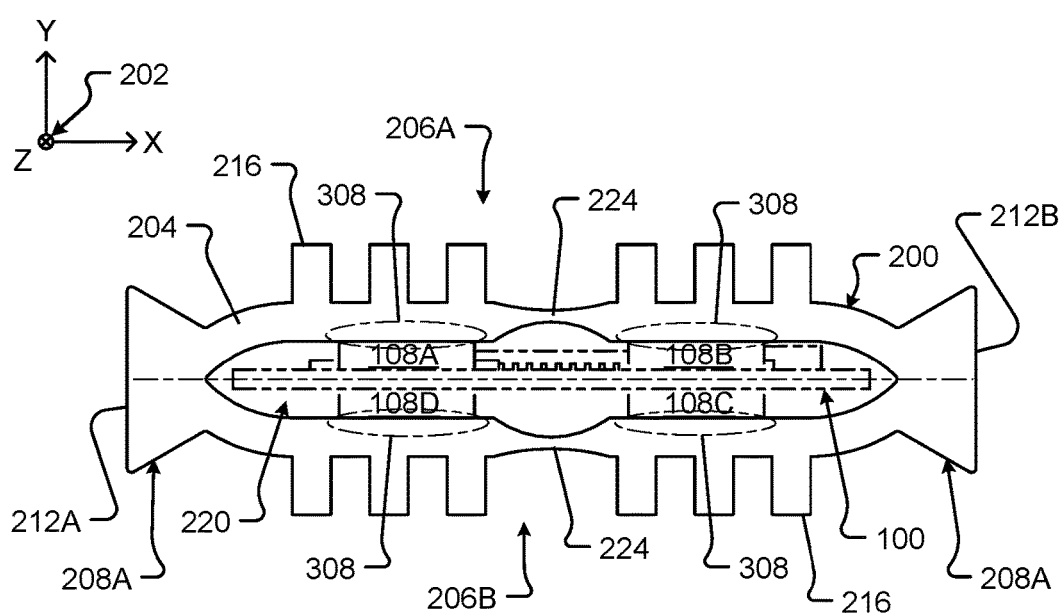
FIG. 3B shows a front elevation view of a sealable multi-surface electronics thermal conduction package in contact with inserted electronics in accordance with embodiments of the present disclosure.

FIGS. 3A and 3B show front elevation views of the package 200 during assembly stages inserting electronics, such as a PCBA 100, into the receiving cavity 220. In FIG. 3A, the package 200 is shown in the second, or flexed, state. While in the flexed state, the applied force 230 holds, or maintains, the package 200 in an "open" configuration where the receiving cavity has an increased cavity height, (HC+Y). In the second state, the increased cavity height, (HC+Y) provides clearance 304 around the heat generating elements 108A-D and/or other electronic components. The clearance 304 allows the PCBA 100 to be inserted into the receiving cavity 220 of the package 200. In some embodiments, and while in the second state, the clearance 304 may allow the PCBA 100 to be inserted into the receiving cavity 220 of the package 200 without any interference or restriction between the PCBA 100 and the package 200.

In FIG. 3B, the package 200 is shown in the first, or substantially unflexed, state. As described above, the package 200 may be unflexed (e.g., having no applied force 230 flexing the package 200, etc.) but may provide a clamping force against the heat generating elements 108A-D holding the PCBA 100 in place inside the receiving cavity 220 of the package 200. As shown in FIG. 3B, at least one interior surface of the upper portion 206A of the package 200 is contacting the upper heat generating elements 108A-B at thermal contact areas 308, while at least one interior surface of the lower portion 206B of the package 200 is contacting the lower heat generating elements 108CA-D at opposing thermal contact areas 308. The interior surfaces of the receiving cavity 220 may be in contact, or coplanar, with the heat emitting surfaces 110A-D of the heat generating elements 108A-D. In some embodiments, a thermal interface material (TIM) may be disposed between the at least one interior surface of the receiving cavity 220 and the heat generating elements 108A-D. The TIM may be a thermally conductive grease, tape, adhesive, or other thin material configured to provide an effective thermal path (e.g., a thermal coupling, etc.) between the heat generating elements 108CA-D of the PCBA 100 and the material of the package 200.

Referring now to FIGS. 4A-4F, perspective views of different steps in an assembly process for the sealable multi-surface electronics thermal conduction package with integrated electronics 400 are shown in accordance with embodiments of the present disclosure. In some embodiments, the method of manufacturing described in conjunction with FIG. 6 may correspond to one or more of the steps illustrated in conjunction with FIGS. 4A-4F.

Figure 4A:
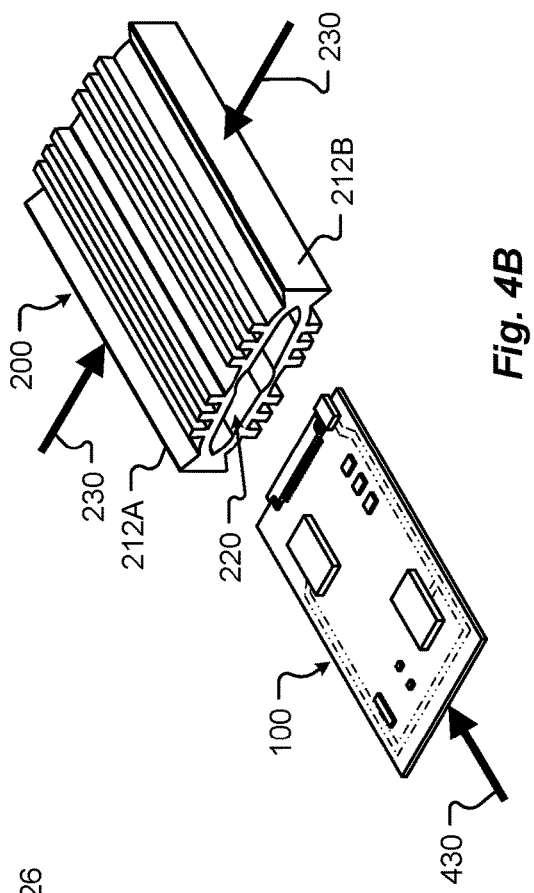
FIG. 4A shows a perspective view of a first assembly state of the sealable multi-surface electronics thermal conduction package and electronics in accordance with embodiments of the present disclosure.

As shown in FIG. 4A, a package 200 is provided in a first, unflexed, state prepared for electronics integration. The package 200 may correspond to any of the packages 200, 500 described herein. The PCBA 100 may be aligned with the receiving cavity 220 of the package 200 in FIG. 4A. In some embodiments, the front 122 of the PCBA 100 or the rear 126 of the PCBA 100 may be inserted into the receiving cavity 220 first. The receiving cavity 220 may be open on one or more of a front 222 and/or rear 222 of the package 200. In some cases, the PCBA 100 may be inserted in either open end (e.g., the front 222 and/or rear 222) of the receiving cavity 220.

Figure 4B:
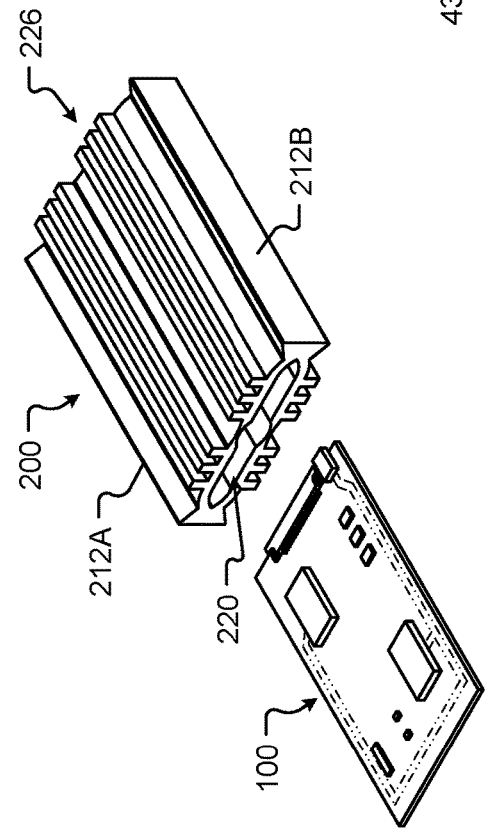
FIG. 4B shows a perspective view of a second assembly state of the sealable multi-surface electronics thermal conduction package and electronics in accordance with embodiments of the present disclosure.

In FIG. 4B, the package 200 may be opened into the second, flexed, state by applying a compressive force 230 to the first and/or second contact surfaces 212A, 212B of the package 200. As provided above, this compressive force 230 may increase an internal dimension (e.g., the cavity height, HC, by an opening distance, Y. The increased internal dimension of the receiving cavity 220 may provide clearance 304 for the PCBA 100 to be inserted therein. Once aligned with the receiving cavity 220, the PCBA 100 may be moved, in an insertion direction 430, into the package 200, while the compressive force 230 is continually applied to the package 200.

Figure 4C:
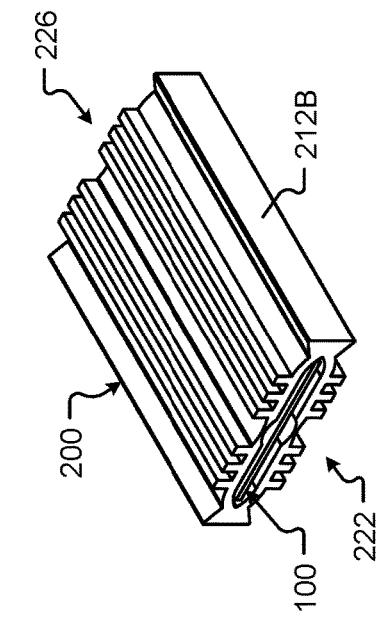
FIG. 4C shows a perspective view of a third assembly state of the sealable multi-surface electronics thermal conduction package and electronics in accordance with embodiments of the present disclosure.
Figure 4D:
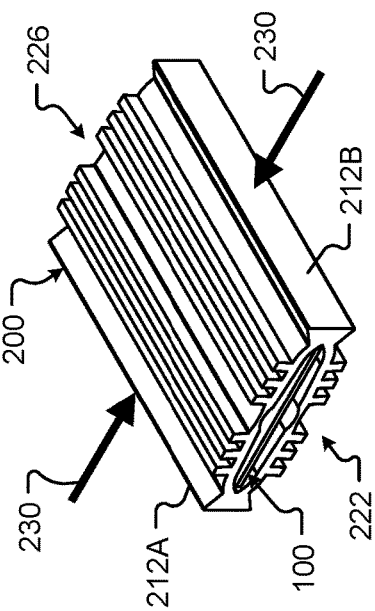
FIG. 4D shows a perspective view of a fourth assembly state of the sealable multi-surface electronics thermal conduction package and electronics in accordance with embodiments of the present disclosure.

The PCBA 100 may be oriented, located, or otherwise positioned inside the package 200 while the compressive force 230 is maintained, as shown in FIG. 4C. In FIG. 4C, the PCBA 100 is shown completely inside the receiving cavity 220. Once the PCBA 100 is positioned inside the receiving cavity 220 relative to the front 222 and/or rear 226 of the package 200, the compressive force 230 may be released. Releasing the compressive force 230 may allow the package to substantially return from the second state to the first state, as illustrated in FIG. 4D.

Next, the package 200 may be sealed with one or more endplates 404, 408, as shown in FIGS. 4E and 4F. The endplates 404, 408 may substantially match the geometry or shape of an end 222, 226 of the package 200. In some embodiments, the endplates 404, 408 may substantially follow a shape of the profile surface 204 of the package 200. In any event, the endplates 404, 408 may be adhered, affixed, brazed, welded, or otherwise attached to the ends 222, 226 of the package 200, respectively. It is an aspect of the present disclosure that the endplates 404, 408 when attached to the package 200 may hermetically seal the package 200 and, more specifically, seal the interior space of the receiving cavity 220 including the PCBA 100 from an environment outside of the receiving cavity 220.

In some embodiments, one or more of the endplates 404, 408 may include a number of connectors, electrical interconnections, or other interconnection features 412 or passthroughs formed in a portion of the endplate 404, 408. The connectors 116A, 116B of the PCBA 100 may be interconnected with one or more of these interconnection features 412 providing a conductive path for one or more of communication and power between the inside of the sealed receiving cavity 220 and the outside of the package 200. As shown in FIG. 4E, the rear endplate 408 includes a series of interconnection features 412 configured as a series of small sealed connectors 416, pins, and/or sealable passthroughs 418. In some embodiments, the sealed connectors 416 may be configured as one or more conductive pins disposed in respective holes of the endplate 408, where the hole is filled with a potting material. In one embodiment, the pins may be surrounded by glass forming a glass to metal seal between the pins and the holes in the endplate 408. In some cases, a pseudo-hermetic seal may be achieved via a passthrough connector disposed in an opening, aperture, or hole in the endplate 408, the passthrough connector sealed in the opening, aperture, or hole by one or more gaskets and/or O-rings. The completed sealable multi-surface electronics thermal conduction package with integrated electronics 400 (e.g., with endplates 404, 408 sealed to the package 200, etc.) is shown in the perspective view of FIG. 4F.

In some embodiments, the operations of assembly described herein may be reversed to rework or disassemble the package 200 and/or remove or replace the PCBA 100 from the package 200.

Figures 5A, 5B:
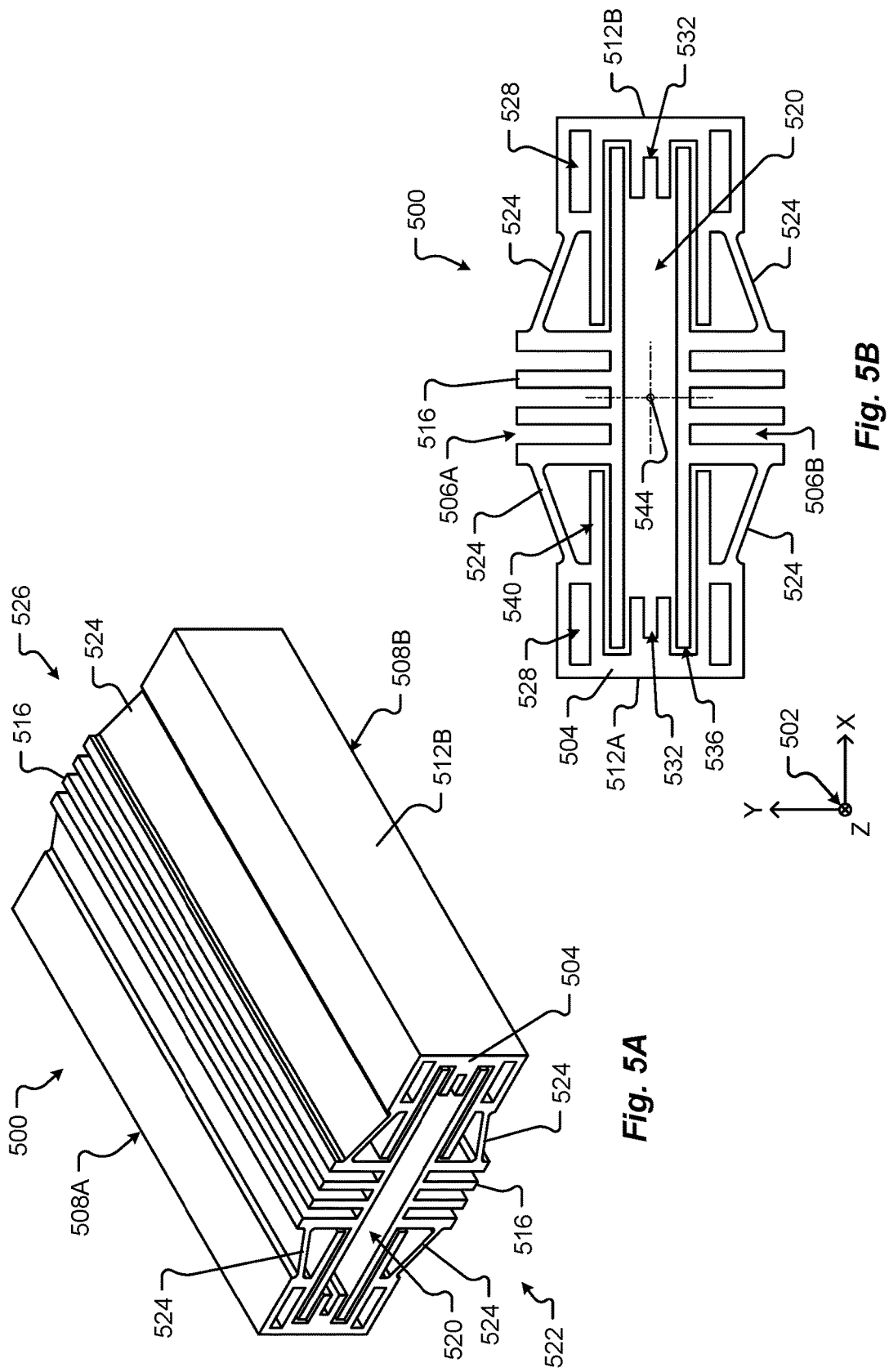
FIG. 5A shows a perspective view of a sealable multi-surface electronics thermal conduction package in accordance with embodiments of the present disclosure.
FIG. 5B shows a front elevation view of the sealable multi-surface electronics thermal conduction package of FIG. 5A in accordance with embodiments of the present disclosure.

FIG. 5A shows a perspective view of a sealable multi-surface electronics thermal conduction package 500 in accordance with embodiments of the present disclosure. The package 500 show in FIGS. 5A-5D may include similar, if not identical, features to those described in conjunction with the package 200 shown in FIGS. 2A-2C. As can be appreciated, the description of the package 200, or the assembly of the PCBA 100 in the package 200, may apply to the package 500 shown in FIGS. 5A-5D, and vice versa.

The package 500 may comprise a body including a profile, or extrusion, surface 504 and shape having a first end 508A, a second end 508B, a first contact surface 512A (not shown in FIG. 5A), a second contact surface 512B, and a hollow space, or electronics receiving cavity, 520 disposed therebetween. The package 500 may include a number of heat sink elements 516 configured to transfer thermal energy from a surface of the body (e.g., inside the receiving cavity 520, etc.) to an environment surrounding the body. The heat sink elements 516 may be configured as straight fins, protrusions, pins, flared fins, etc., and/or combinations thereof. In some embodiments, the heat sink elements 516 may extend along a length of the package 500, for example, from the front 522 (e.g., at the profile surface 504) to the rear 526 of the package 500.

In some embodiments, the package 500 may include one or more controlled bend regions, areas, or flexures, 524. As shown in FIGS. 5A-5D, the package 500 may include symmetrical sets of flexures 524 disposed about a center 544 of the package 500. In some embodiments, and as shown in FIG. 5B, the package 500 may be centerline symmetrical about center planes passing through the center 544 of the package 500. For instance, the package 500 may be symmetrical about the YZ-plane running through the center 544 of the package 500 and/or symmetrical about the XZ-plane running through the center 544 of the package 500. The flexures 524 may be shaped such that a force 530 applied to the first and/or second contact surfaces 512A, 512B of the package 500 displaces the upper and lower portions 506A, 506B of the package 500 in a direction (e.g., the Y-axis direction) away from the center of the package 500. The orientation of the flexures 524 in the package 500 may provide a linear and/or substantially orthogonal translation of the upper and lower portions 506A, 506B from the center 544 of the package 500. Among other things, this linear movement may allow the internal heat contacting surfaces of the package 500 (e.g., the surfaces disposed inside the receiving cavity 520, etc.) to move such that they may remain substantially parallel (e.g., to one another) and/or substantially orthogonal to the first and/or second contact surfaces 512A, 512B of the package 500.

In some embodiments, the package 500 may include one or more PCB substrate channels 532. The PCB substrate channels 532 may be sized to receive and locate the PCB substrate 104 inside the receiving cavity 520 of the package 500. In some cases, the PCB substrate channels 532 may capture one or more edges of the PCB substrate 104, preventing the PCBA 100 from moving in the Y-axis direction inside the receiving cavity 520. The PCB substrate channels 532 may be sized to allow some movement of the PCBA 100 along the X-axis inside the receiving cavity 520 and/or allow the sides 508A, 508B of the package 500 to move relative to the PCBA 100 when compressed and/or released.

The package 500 may include one or more end-of-travel (EOT) stops 536, 540 to prevent over-flexing of the flexures 524 (e.g., where, without the stops, squeezing the package 500 could force the flexures 524 past their elastic range, etc.) during assembly and/or disassembly. In some embodiments, these EOT stops 536, 540 may be built into the profile 504, body, extruded shape, and/or other portion of the package 500. In one embodiment, a compression EOT stop 536 may be built into a portion of the heat transfer contacting surfaces adjacent to the first and second sides 508A, 508B of the package 500. This compression EOT stop 536 may serve to resist movement of the sides 508A, 508B of the package 500 from compressing beyond a predefined amount or distance by, for example, contacting an internal portion of the sides 508A, 508B of the package 500 at a maximum compression (e.g., a compression amount determined to provide ample clearance 304 for inserting the PCBA 100, etc.). In some embodiments, a vertical displacement EOT stop 540 may prevent the upper and lower portions 506A, 506B from extending outwardly from the center 544 of the package 500 beyond a predefined amount or distance by, for example, contacting an internal portion of the upper and lower portions 506A, 506B of the package 500 at a maximum displacement (e.g., a displacement amount determined to provide ample clearance 304 inside the receiving cavity 520 for inserting the PCBA 100 without restriction, etc.)

Similar to the package 200 described in conjunction with FIGS. 2A-C, the package 500 may be made from plastic, metal, carbon fiber, linen, composites, epoxy resin, etc., and/or combinations thereof. In one embodiment, the material of the package 500 may be thermally conductive. Thermally conductive material may provide a thermal path from an interior space 520 of the package 500 to an environment outside the package. This thermal path may serve as the path by which heat can be transferred from electronics contained inside the package 500. Examples of thermally conductive materials may include, but are in no way limited to, steel, titanium, aluminum, copper, tin, nickel, iron, etc., alloys thereof, and/or combinations thereof. The package 500 may be machined, wire electrical discharge machined (EDM), formed, molded, cast, extruded, etc., and/or combinations thereof. In one embodiment, the material of the package 500 may be extrudable and thermally conductive. One example of an extrudable and thermally conductive material is aluminum. In any event, the package 500 may be designed such that the profile surface 504 defines a shape corresponding to at least one shape of an extrusion die used to create the package 500. In this example, the package 500 may be formed by heating and softening a billet of extrudable material (e.g., aluminum, etc.), forcing the billet of extrudable material through one or more extrusion dies (e.g., including the features, or inverse features, of the profile shape 504, etc.), cooling the extruded material as it exits the one or more extrusion dies, and then cutting the extruded material to length. Once extruded and cut to length, the body can be deburred, cleaned, machined, and/or finished (e.g., coated, anodized, nickel plated, etc.). The extruded body provides a cost-effective and integral, one-piece, housing for the sealable multi-surface electronics thermal conduction package 500.

FIG. 5B shows a front elevation view of the sealable multi-surface electronics thermal conduction package 500 of FIG. 5A. As provided above, the package 500 may be centerline symmetrical, for example, along a centerline running through the center 544 of the package 500 along the X-axis and/or along a centerline running through the center 544 of the package 500 along the Y-axis. The package 500 shown in FIG. 5B, may correspond to a first, unflexed, or normal state including a receiving cavity 520, configured as a hollow space in the center of the package 500. The package 500 may have a cavity height, HC, as previously described in conjunction with FIGS. 2A-2C. The cavity height, HC, may be defined as a distance between a first interior surface of the package 500 and a second opposing interior surface of the package 500 along the Y-axis. This cavity height, HC, may remain substantially the same along the X-axis direction from a position adjacent to the first end 508A of the package 500 to a position adjacent to the second end 508B of the package 500. Additionally or alternatively, the cavity height, HC, may remain substantially the same along the length of the package (e.g., along the Z-axis direction). In some embodiments, the cavity height, HC, may be sized to substantially match the overall height, HP, of the PCBA 100 (see, e.g., FIG. 1C). In one embodiment, the cavity height, HC, in the unflexed state may be undersized, or sized less than the overall height, HP, of the PCBA 100, by an amount to provide a clamping, or holding, force on any electronics (e.g., the PCBA 100, etc.) disposed inside the receiving cavity 520. In another embodiment, the cavity height, HC, may be oversized in the unflexed state, or sized greater than the overall height, HP, of the PCBA 100, by an amount to allow a thermal interface material to be inserted between any inserted electronics (e.g., the PCBA 100, etc.) and the interior surfaces of the receiving cavity 520.

Figure 5C:
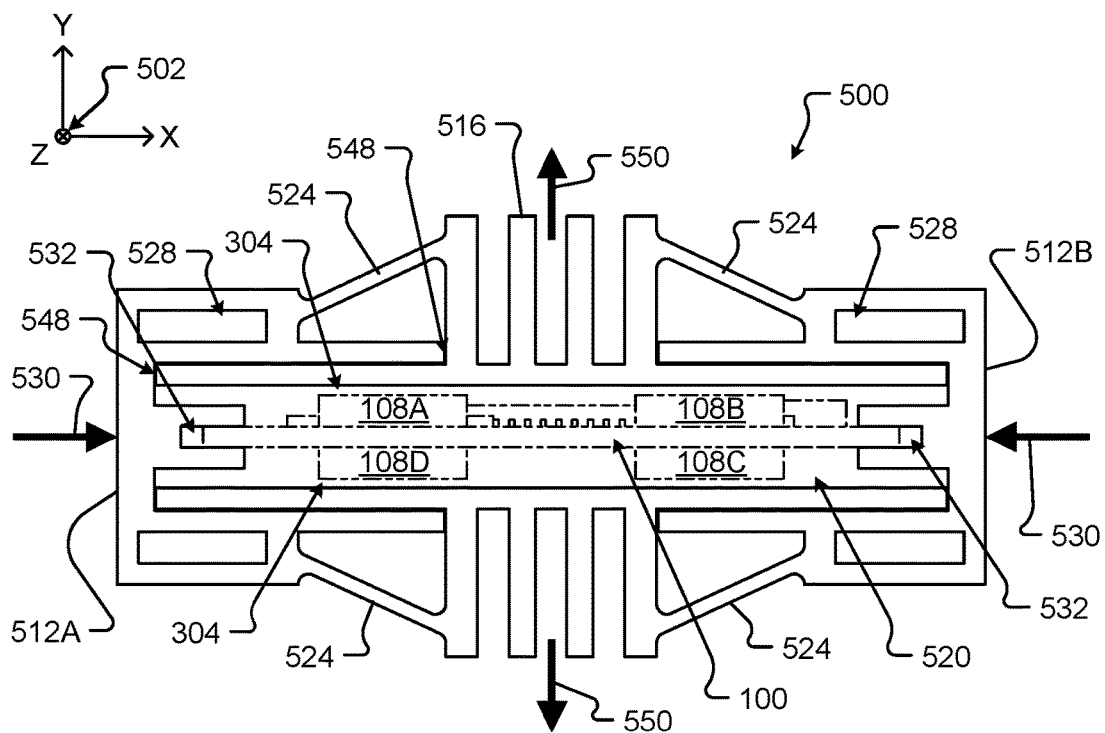
FIG. 5C shows a front elevation view of a sealable multi-surface electronics thermal conduction package and inserted electronics in accordance with embodiments of the present disclosure.

FIGS. 5C and 5B show front elevation views of the package 500 during assembly stages inserting electronics, such as the PCBA 100, into the receiving cavity 520. In FIG. 5C, the package 500 is shown in the second, or flexed, state. In particular, as the sides 508A, 508B of the package 500 are compressed, or squeezed, together (e.g., toward the center 544) causing the upper and lower portions 506A, 506B of the package 500 to move outwardly, from the center 544, and away from one another, in a linear direction 550 along the Y-axis. While in the flexed state, the applied force 530 holds, or maintains, the package 500 in an "open" configuration where the receiving cavity has an increased cavity height, (HC+Y). In the second state, the increased cavity height, (HC+Y) provides clearance 304 around the heat generating elements 108A-D and/or other electronic components of the PCBA 100. The clearance 304 allows the PCBA 100 to be inserted into the receiving cavity 520 of the package 500. In some embodiments, and while in the second state, the clearance 304 may allow the PCBA 100 to be inserted into the receiving cavity 520 of the package 500 without any interference or restriction between the PCBA 100 and the package 500. As shown in FIG. 5C, the clearance 304 provided by the displacement of the upper and lower portions 506A, 506B of the package 500 is the same at any point along the heat generating elements 108A-D. For example, the clearance 304 provides a space between the heat emitting surfaces 110A-D of the heat generating elements 108A-D and the substantially parallel internal heat contacting surfaces of the receiving cavity 520.

Figure 5D:
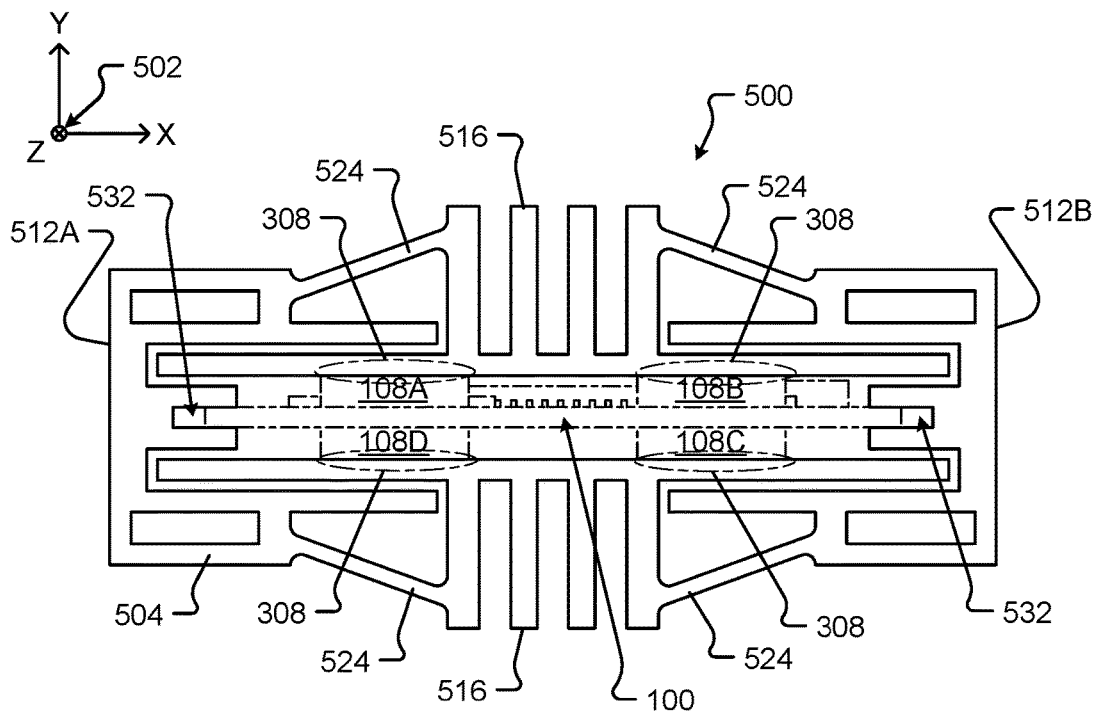
FIG. 5D shows a front elevation view of a sealable multi-surface electronics thermal conduction package in contact with inserted electronics in accordance with embodiments of the present disclosure.

In FIG. 5D, the package 500 is shown in the first, or substantially unflexed, state. As described above, the package 500 may be unflexed (e.g., having no applied force 530 flexing the package 500, etc.) but may provide a clamping force against the heat generating elements 108A-D holding the PCBA 100 in place inside the receiving cavity 520 of the package 500. As shown in FIG. 5D, at least one interior surface of the upper portion 506A of the package 500 is contacting the upper heat generating elements 108A-B at thermal contact areas 308, while at least one interior surface of the lower portion 506B of the package 500 is contacting the lower heat generating elements 108CA-D at opposing thermal contact areas 308. The interior surfaces of the receiving cavity 520 may be in contact, or coplanar, with the heat emitting surfaces 110A-D of the heat generating elements 108A-D. In some embodiments, a thermal interface material (TIM) may be disposed between the at least one interior surface of the receiving cavity 520 and the heat generating elements 108A-D. The TIM may be a thermally conductive grease, tape, adhesive, or other thin material configured to provide an effective thermal path (e.g., a thermal coupling, etc.) between the heat generating elements 108CA-D of the PCBA 100 and the material of the package 500.

Figure 6:
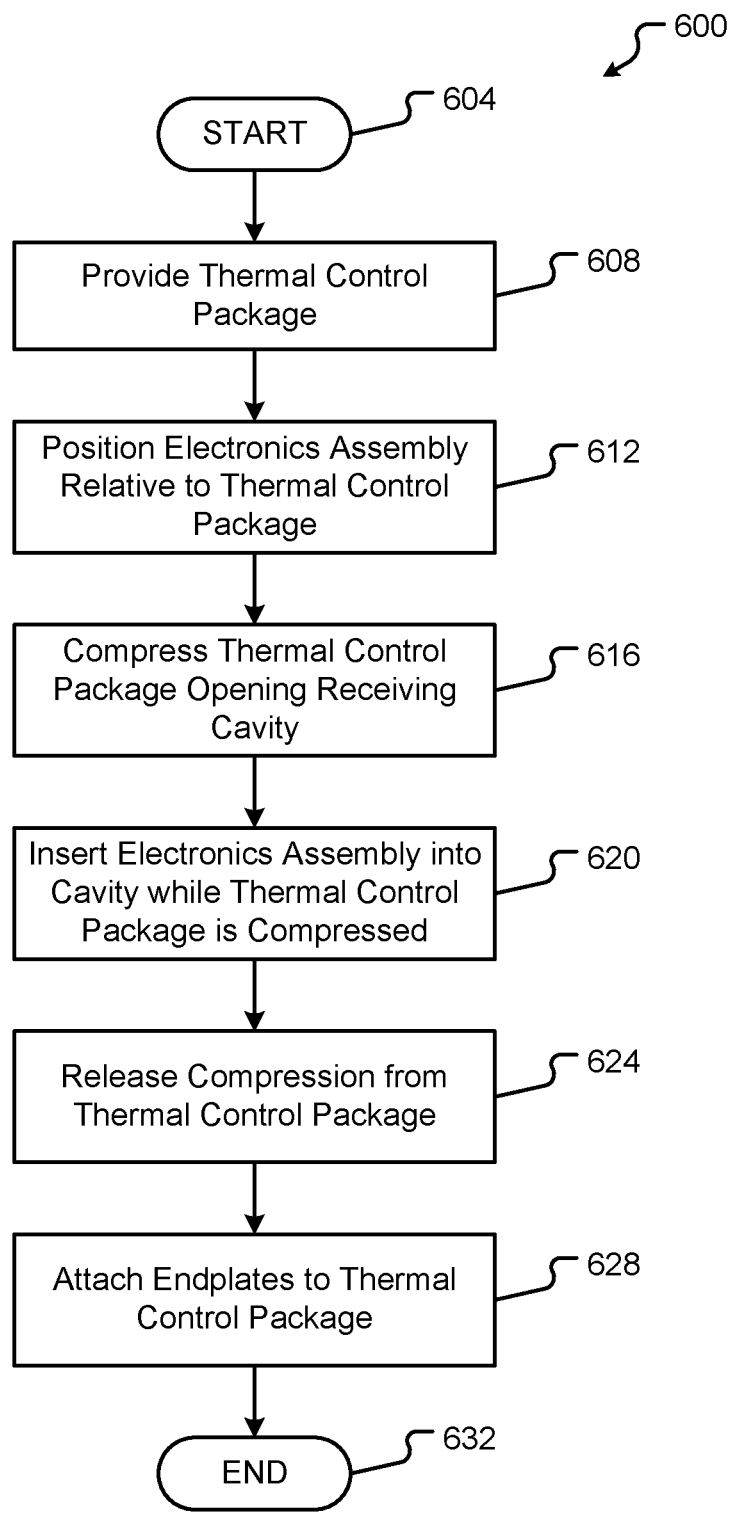
FIG. 6 is a flow diagram of a method for assembling electronics in a sealable multi-surface electronics thermal conduction package in accordance with embodiments of the present disclosure.

FIG. 6 is a flow diagram of a method 600 for assembling electronics in a sealable multi-surface electronics thermal conduction package 200, 500 in accordance with embodiments of the present disclosure. While a general order for the steps of the method 600 is shown in FIG. 6, the method 600 can include more or fewer steps or can arrange the order of the steps differently than those shown in FIG. 6. Generally, the method 600 starts with a start operation 604 and ends with an end operation 632. The method 600 can be executed as a set of computer-executable instructions executed by an assembly machine (e.g., robotic assembly system, automation assembly system, etc.) and encoded or stored on a computer readable medium. Hereinafter, the method 600 shall be explained with reference to the components, devices, assemblies, environments, etc. described in conjunction with FIGS. 1-5D.

The method 600 may begin at step 604 and continue by providing a thermal control package, for example, the package 200, 500 (step 608). In some embodiments, the provided package 200, 500 may be cleaned, deburred, coated, plated, and/or finished. Next, the method 600 continues by positioning an electronics assembly, for example, a PCBA 100 relative to the package 200, 500 (step 612). In some embodiments, positioning the PCBA 100 relative to the package 200, 500 may include aligning the PCBA 100 with the receiving cavity 220, 520 of the package 200, 500. Steps 608 and 612, providing the package 200, 500 and positioning the PCBA 100 relative to the package 200, 500 may be provided as shown and described in conjunction with FIG. 4A above.

Once the PCBA 100 is aligned with the receiving cavity 220, 520, the package 200, 500 may be compressed by applying at least one compressive force 230, 530 to the sides 208A, 208B, 508A, 508B of the package 200, 500 (step 616). As described above, the compressive force 230, 530 may open a dimension of the receiving cavity 220, 520 to receive the PCBA 100. In one embodiment, the package 200, 500 may be compressed via a vise, gripper, or other device. The compression device may be screw-actuated, pneumatically-actuated, hydraulically-actuated, etc., and/or combinations thereof. While the package 200, 500 is compressed, expanding a dimension (e.g., height, HC) of the receiving cavity 220, 520, the PCBA 100 may be inserted into the receiving cavity 220, 520 without restriction (step 620). In some embodiments, while the package 200, 500 is maintained in the second (compressed/flexed) state, the position of the PCBA 100 may be adjusted inside the package 200 (e.g., along the Z-axis direction, etc.). This adjustment may ensure that the ends 122, 126 of the PCBA 100 are disposed between, and not extending past, the ends 222, 226, 522, 526 of the package 200, 500. These steps 616, 620 may correspond to the steps illustrated and described in conjunction with FIGS. 4B and 4C above.

When the PCBA 100 is properly positioned inside the package 200, 500, (e.g., inside the receiving cavity 220, 520, etc.) the method 600 may continue by releasing the compressive force 230, 530 from the sides 208A, 208B, 508A, 508B of the package 200, 500 (step 624). Releasing the force 230, 530 allows the elastic energy of the package 200, 500 stored in, for example, the flexures 224, 524 to be converted into kinetic energy moving the package from the second, flexed, state to the first, unflexed, state. This elastic movement allows the package 200, 500 to automatically return to a substantially unflexed state without requiring any application of a force external to the material of the package 200, 500.

Next, the method 600 may proceed by attaching the endplates 404, 408 to the package 200, 500 (step 628). The endplates 404, 408 may be adhered, affixed, brazed, welded, or otherwise attached to the ends 222, 226, 522, 526 of the package 200, 500, respectively. It is an aspect of the present disclosure that the endplates 404, 408 when attached to the package 200 may hermetically seal the package 200, 500 and, more specifically, seal the interior space of the receiving cavity 220, 520 including the PCBA 100 from an environment outside of the receiving cavity 220, 520. In some embodiments, (e.g., prior to attaching the endplates 404, 408 to the package 200, 500) the connectors 116A, 116B of the PCBA 100 may be interconnected to the one or more interconnection features 412 disposed on at least one of the endplates 404, 408. This interconnection may provide a conductive path for one or more of communication and/or power between the inside of the sealed receiving cavity 220, 520 and the outside of the package 200, 500.

In some embodiments, one of the endplates 404, 408 may be attached to the package 200, 500 before the other of the endplates 408, 404 is attached to the package 200, 500. After one of the endplates 404, 408 is attached to the package 200, 500, the receiving cavity 220, 520 of the package 200, 500, specifically the areas in between the interior surfaces of the receiving cavity 220, 520 and the surfaces of the PCBA 100 may be filled with a material. The material may be a gas, a dielectric material, a thermally conductive material, an epoxy potting compound, etc., and/or combinations thereof. The material may provide protection of the components (e.g., electronic components, PCBA 100, etc.) inside the receiving cavity 220, 520. In one embodiment, the material may provide enhanced thermally conductive pathways between the various components of the PCBA 100 and the interior surfaces of the receiving cavity 220, 520. The material may be inserted as a fluid that, when cured, hardens in the open spaces between the PCBA 100 and the interior surfaces of the receiving cavity 220, 520. The material can secure the components of the PCBA 100 in place inside the receiving cavity 220, 520, and relative to one another, providing enhanced shock resistance and protection from failures due to separation of components from the PCBA 100. In some embodiments, the material inserted may serve to prevent corrosion of the electronic components inside the receiving cavity 220, 520 (e.g., providing an inert reactive environment, etc.). Once filled and/or cured, the other endplate 408, 404 may be attached to the opposite end of the package 200, 500 sealing the PCBA 100 inside the receiving cavity 220, 520. In any event, attaching the endplates 404, 408 and sealing the package 200, 500 forming the complete sealable multi-surface electronics thermal conduction package with integrated electronics 400 may correspond to the steps illustrated and described in conjunction with FIGS. 4E and 4F above. The method 600 ends at step 632.

It is an aspect of the present disclosure that a complete sealable multi-surface electronics thermal conduction package with integrated electronics 400 may be reworked, disassembled, or otherwise modified. In this case, the steps described in conjunction with FIG. 6 may be reversed to open the integrated package 400. For example, disassembling at least a portion of the integrated package 400 may include first detaching one or more of the endplates 404, 408 from the package 200, 500 (e.g. the reverse of step 628). This detachment may include cutting, machining, or otherwise separating at least one of the endplates 404, 408 from the body of the package 200, 500. Once at least one of the endplates 404, 408 has been removed, the package 200, 500 may be compressed to release the PCBA 100 from the receiving cavity 220, 520 (e.g., the reverse of step 624). The reverse method may continue by removing the PCBA 100, releasing the compressive force from the package 200, 500, and separating the parts making up the PCBA 100 and package 200, 500.

In the event that the PCBA 100 is to be replaced, the reverse method may be performed up to the point that the PCBA 100 is separated from the package 200, 500 and then the method 600 may be repeated (e.g., at step 612) to insert a new PCBA 100 in the receiving cavity 220, 520. The method 600 may proceed until the new PCBA 100 is sealed inside the package 200, 500 forming the integrated package 400 (step 628).

The exemplary systems and methods of this disclosure have been described in relation to electronics packaging and the thermal control of sealed electronics. However, to avoid unnecessarily obscuring the present disclosure, the preceding description omits a number of known structures and devices. This omission is not to be construed as a limitation of the scope of the claimed disclosure. Specific details are set forth to provide an understanding of the present disclosure. It should, however, be appreciated that the present disclosure may be practiced in a variety of ways beyond the specific detail set forth herein.

A number of variations and modifications of the disclosure can be used. It would be possible to provide for some features of the disclosure without providing others. In some embodiments, the present disclosure provides an electrical interconnection device that can be used between any electrical source and destination. While the present disclosure describes connections between battery modules and corresponding management systems, embodiments of the present disclosure should not be so limited.

Although the present disclosure describes components and functions implemented in the embodiments with reference to particular standards and protocols, the disclosure is not limited to such standards and protocols. Other similar standards and protocols not mentioned herein are in existence and are considered to be included in the present disclosure. Moreover, the standards and protocols mentioned herein, and other similar standards and protocols not mentioned herein are periodically superseded by faster or more effective equivalents having essentially the same functions. Such replacement standards and protocols having the same functions are considered equivalents included in the present disclosure.

The present disclosure, in various embodiments, configurations, and aspects, includes components, methods, processes, systems and/or apparatus substantially as depicted and described herein, including various embodiments, subcombinations, and subsets thereof. Those of skill in the art will understand how to make and use the systems and methods disclosed herein after understanding the present disclosure. The present disclosure, in various embodiments, configurations, and aspects, includes providing devices and processes in the absence of items not depicted and/or described herein or in various embodiments, configurations, or aspects hereof, including in the absence of such items as may have been used in previous devices or processes, e.g., for improving performance, achieving ease, and/or reducing cost of implementation.

The foregoing discussion of the disclosure has been presented for purposes of illustration and description. The foregoing is not intended to limit the disclosure to the form or forms disclosed herein. In the foregoing Detailed Description for example, various features of the disclosure are grouped together in one or more embodiments, configurations, or aspects for the purpose of streamlining the disclosure. The features of the embodiments, configurations, or aspects of the disclosure may be combined in alternate embodiments, configurations, or aspects other than those discussed above. This method of disclosure is not to be interpreted as reflecting an intention that the claimed disclosure requires more features than are expressly recited in each claim. Rather, as the following claims reflect, inventive aspects lie in less than all features of a single foregoing disclosed embodiment, configuration, or aspect. Thus, the following claims are hereby incorporated into this Detailed Description, with each claim standing on its own as a separate preferred embodiment of the disclosure.

Moreover, though the description of the disclosure has included description of one or more embodiments, configurations, or aspects and certain variations and modifications, other variations, combinations, and modifications are within the scope of the disclosure, e.g., as may be within the skill and knowledge of those in the art, after understanding the present disclosure. It is intended to obtain rights, which include alternative embodiments, configurations, or aspects to the extent permitted, including alternate, interchangeable and/or equivalent structures, functions, ranges, or steps to those claimed, whether or not such alternate, interchangeable and/or equivalent structures, functions, ranges, or steps are disclosed herein, and without intending to publicly dedicate any patentable subject matter.

Embodiments include an electronics package, comprising: a body having a peripheral shape including a first side and an opposite second side, and an upper portion and a lower portion disposed between the first and second sides, the peripheral shape extending along a length, the body including a first end surface disposed at a first end of the length and a second end surface disposed at a second end of the length; a receiving cavity disposed inside the peripheral shape between the first and second sides and the upper and lower portions, the receiving cavity passing through the body from the first end surface to the second end surface; and a controlled bend feature disposed in the upper portion of the peripheral shape of the body, wherein the controlled bend feature includes an elastically flexible region of material shaped to direct forces applied to the first and/or second sides along the upper portion and in a direction outwardly from a center of the receiving cavity.

Aspects of the above electronics package include wherein the controlled bend feature includes a cross-sectional area less than a cross-sectional area of the upper portion. Aspects of the above electronics package include wherein the body has an unflexed state and a flexed state, wherein in the unflexed state the receiving cavity includes an interior height running the length of the body, wherein in the flexed state the receiving cavity has an increased interior height running the length of the body, wherein in the unflexed state a first distance separates the first side from the second side and the interior height separates the upper portion from the lower portion, and wherein in the flexed state the first side and second side are separated by a second distance less than the first distance and the upper portion and lower portion are separated from one another by the increased interior height. Aspects of the above electronics package further comprising: a controlled bend feature disposed in the lower portion of the peripheral shape of the body; and a plurality of heat sink elements formed in the upper portion and lower portion and extending from the peripheral shape of the body in a direction outwardly from a center of the body, wherein a first thermal conductive path is formed between a first interior surface of the receiving cavity and the plurality of heat sink elements formed in the upper portion, and wherein a second thermal conductive path is formed between an opposite second interior surface of the receiving cavity and the plurality of heat sink elements formed in the lower portion. Aspects of the above electronics package include wherein the body, the receiving cavity, and the controlled bend features are integrally formed from a single extruded material. Aspects of the above electronics package include wherein the controlled bend feature disposed in the upper portion of the peripheral shape includes a first set of flexures running the length of the body, and wherein the controlled bend feature disposed in the lower portion of the peripheral shape includes a second set of flexures running the length of the body. Aspects of the above electronics package include wherein each of the first set of flexures is disposed at a non-zero angle relative to the first interior surface, and wherein each of the second set of flexures is disposed at a non-zero angle relative to the second interior surface. Aspects of the above electronics package include wherein the upper portion and the lower portion include end-of-travel stops arranged to limit a displacement amount of the first and second sides of the body between the unflexed and flexed states. Aspects of the above electronics package include wherein the receiving cavity includes a set of printed circuit board (PCB) channels running the length of the body and sized to receive and capture at least a portion of a PCB substrate.

Embodiments include an integrated electronics package, comprising: a body having a peripheral shape including a first side and an opposite second side, and an upper portion and a lower portion disposed between the first and second sides, the peripheral shape extending along a length, the body including a first end surface disposed at a first end of the length and a second end surface disposed at a second end of the length; a receiving cavity disposed inside the peripheral shape between the first and second sides and the upper and lower portions, the receiving cavity passing through the body from the first end surface to the second end surface; a controlled bend feature disposed in the upper and lower portions of the peripheral shape of the body, wherein the controlled bend feature includes an elastically flexible region of material shaped to direct forces applied to the first and/or second sides along the upper and lower portions and in a direction outwardly from a center of the receiving cavity; and a printed circuit board assembly (PCBA) disposed in the receiving cavity and between the first and second end surfaces of the body.

Aspects of the above integrated electronics package further comprising: a first endplate substantially matching the peripheral shape of the body; and a second endplate substantially matching the peripheral shape of the body, wherein the first endplate is mechanically attached to the first end surface, wherein the second endplate is mechanically attached to the second end surface, and wherein an environment surrounding the PCBA inside the receiving cavity is sealed from an environment outside the receiving cavity. Aspects of the above integrated electronics package include wherein a set of hermetically-sealed electrical interconnection features are disposed in the second endplate, the hermetically-sealed electrical interconnection features providing an electrical conduit between the environment inside the receiving cavity and the environment outside the receiving cavity, and wherein the PCBA is electrically connected to the hermetically-sealed electrical interconnection features inside the receiving cavity. Aspects of the above integrated electronics package further comprising: a plurality of heat sink elements formed in the upper and lower portions and extending from the peripheral shape of the body in a direction outwardly from a center of the body, wherein a first thermal conductive path is formed between a first interior surface of the receiving cavity and the plurality of heat sink elements formed in the upper portion, and wherein a second thermal conductive path is formed between an opposite second interior surface of the receiving cavity and the plurality of heat sink elements formed in the lower portion. Aspects of the above integrated electronics package include wherein a first thermal interface material is disposed between the first interior surface and a first heat generating element of the PCBA. Aspects of the above integrated electronics package include wherein a second thermal interface material is disposed between the second interior surface and a second heat generating element of the PCBA, wherein the first heat generating element of the PCBA is disposed on a first side of a substrate of the PCBA, and wherein the second heat generating element of the PCBA is disposed on an opposite second side of the substrate of the PCBA. Aspects of the above integrated electronics package include wherein the body, the receiving cavity, and the controlled bend features are integrally formed from a single extruded material. Aspects of the above integrated electronics package further comprising: a set of printed circuit board (PCB) channels running the length of the body, wherein the PCBA is at least partially captured in the PCB channels. Aspects of the above integrated electronics package include wherein the environment surrounding the PCBA inside the receiving cavity is filled with a potting material.

Embodiments include a method of assembling an integrated electronics package, comprising: providing an electronics package, comprising: a body having a peripheral shape including a first side and an opposite second side, and an upper portion and a lower portion disposed between the first and second sides, the peripheral shape extending along a length, the body including a first end surface disposed at a first end of the length and a second end surface disposed at a second end of the length; a receiving cavity disposed inside the peripheral shape between the first and second sides and the upper and lower portions, the receiving cavity passing through the body from the first end surface to the second end surface; and a controlled bend feature disposed in the upper and lower portions of the peripheral shape of the body, wherein the controlled bend feature includes an elastically flexible region of material shaped to direct forces applied to the first and/or second sides along the upper and lower portions and in a direction outwardly from a center of the receiving cavity; aligning a printed circuit board assembly (PCBA) with the receiving cavity of the body; applying a compressive force to the first and/or second side of the body, wherein the compressive force flexes the controlled bend features and moves the upper portion and lower portion in opposite directions outwardly from the center of the receiving cavity providing a PCBA clearance height inside the receiving cavity; inserting the PCBA into the receiving cavity having the PCBA clearance height, while the compressive force is maintained, wherein the PCBA is positioned between the first and second ends of the body; releasing the compressive force applied, wherein upon releasing the compressive force applied the controlled bend features return to an unflexed state moving the upper portion and lower portion in a direction toward the center of the receiving cavity providing a reduced PCBA clearance height clamping the PCBA inside the receiving cavity; attaching a first endplate to the first end of the body; and attaching a second endplate to the second end of the body, wherein attachment of the first and second endplates isolate an environment surrounding the PCBA inside the receiving cavity from an environment outside the receiving cavity.

Aspects of the above method include wherein prior to attaching the second endplate, the method further comprises: inserting a potting material into the environment surrounding the PCBA inside the receiving cavity providing a mechanical connection between electronic components on the PCBA and interior surfaces of the receiving cavity.

Any one or more of the aspects/embodiments as substantially disclosed herein.

Any one or more of the aspects/embodiments as substantially disclosed herein optionally in combination with any one or more other aspects/embodiments as substantially disclosed herein.

One or more means adapted to perform any one or more of the above aspects/embodiments as substantially disclosed herein.

The phrases "at least one," "one or more," "or," and "and/or" are open-ended expressions that are both conjunctive and disjunctive in operation. For example, each of the expressions "at least one of A, B and C," "at least one of A, B, or C," "one or more of A, B, and C," "one or more of A, B, or C," "A, B, and/or C," and "A, B, or C" means A alone, B alone, C alone, A and B together, A and C together, B and C together, or A, B and C together.

The term "a" or "an" entity refers to one or more of that entity. As such, the terms "a" (or "an"), "one or more," and "at least one" can be used interchangeably herein. It is also to be noted that the terms "comprising," "including," and "having" can be used interchangeably.

The term "automatic" and variations thereof, as used herein, refers to any process or operation, which is typically continuous or semi-continuous, done without material human input when the process or operation is performed. However, a process or operation can be automatic, even though performance of the process or operation uses material or immaterial human input, if the input is received before performance of the process or operation. Human input is deemed to be material if such input influences how the process or operation will be performed. Human input that consents to the performance of the process or operation is not deemed to be "material."

The terms "determine," "calculate," "compute," and variations thereof, as used herein, are used interchangeably and include any type of methodology, process, mathematical operation or technique.

What is claimed is:

1. An electronics package, comprising:
a body having a peripheral shape including a first side and an opposite second side, and an upper portion and a lower portion disposed between the first and second sides, the peripheral shape extending along a length, the body including a first end surface disposed at a first end of the length and a second end surface disposed at a second end of the length;
a receiving cavity disposed inside the peripheral shape between the first and second sides and the upper and lower portions, the receiving cavity passing through the body from the first end surface to the second end surface; and
a controlled bend feature disposed in the upper portion of the peripheral shape of the body, wherein the controlled bend feature includes an elastically flexible region of material shaped to direct forces applied to the first and/or second sides along the upper portion and in a direction outwardly from a center of the receiving cavity, and wherein the controlled bend feature includes a cross-sectional area less than a cross-sectional area of the upper portion.

2. The electronics package of claim 1, wherein the body has an unflexed state and a flexed state, wherein in the unflexed state the receiving cavity includes an interior height running the length of the body, wherein in the flexed state the receiving cavity has an increased interior height running the length of the body, wherein in the unflexed state a first distance separates the first side from the second side and the interior height separates the upper portion from the lower portion, and wherein in the flexed state the first side and second side are separated by a second distance less than the first distance and the upper portion and lower portion are separated from one another by the increased interior height.

3. The electronics package of claim 2, further comprising:
a controlled bend feature disposed in the lower portion of the peripheral shape of the body; and
a plurality of heat sink elements formed in the upper portion and lower portion and extending from the peripheral shape of the body in a direction outwardly from a center of the body, wherein a first thermal conductive path is formed between a first interior surface of the receiving cavity and the plurality of heat sink elements formed in the upper portion, and wherein a second thermal conductive path is formed between an opposite second interior surface of the receiving cavity and the plurality of heat sink elements formed in the lower portion.

4. The electronics package of claim 3, wherein the body, the receiving cavity, and the controlled bend features are integrally formed from a single extruded material.

5. The electronics package of claim 4, wherein the controlled bend feature disposed in the upper portion of the peripheral shape includes a first set of flexures running the length of the body, and wherein the controlled bend feature disposed in the lower portion of the peripheral shape includes a second set of flexures running the length of the body.

6. The electronics package of claim 5, wherein each of the first set of flexures is disposed at a non-zero angle relative to the first interior surface, and wherein each of the second set of flexures is disposed at a non-zero angle relative to the second interior surface.

7. The electronics package of claim 6, wherein the upper portion and the lower portion include end-of-travel stops arranged to limit a displacement amount of the first and second sides of the body between the unflexed and flexed states.

8. The electronics package of claim 7, wherein the receiving cavity includes a set of printed circuit board (PCB) channels running the length of the body and sized to receive and capture at least a portion of a PCB substrate.

9. An integrated electronics package, comprising:
a body having a peripheral shape including a first side and an opposite second side, and an upper portion and a lower portion disposed between the first and second sides, the peripheral shape extending along a length, the body including a first end surface disposed at a first end of the length and a second end surface disposed at a second end of the length;

a receiving cavity disposed inside the peripheral shape between the first and second sides and the upper and lower portions, the receiving cavity passing through the body from the first end surface to the second end surface;

a controlled bend feature disposed in the upper and lower portions of the peripheral shape of the body, wherein the controlled bend feature includes an elastically flexible region of material shaped to direct forces applied to the first and/or second sides along the upper and lower portions and in a direction outwardly from a center of the receiving cavity;

a printed circuit board assembly (PCBA) disposed in the receiving cavity and between the first and second end surfaces of the body;

a first endplate substantially matching the peripheral shape of the body; and a second endplate substantially matching the peripheral shape of the body, wherein the first endplate is mechanically attached to the first end surface, wherein the second endplate is mechanically attached to the second end surface, and wherein an environment surrounding the PCBA inside the receiving cavity is sealed from an environment outside the receiving cavity.

10. The integrated electronics package of claim 9, wherein a set of hermetically-sealed electrical interconnection features are disposed in the second endplate, the hermetically-sealed electrical interconnection features providing an electrical conduit between the environment inside the receiving cavity and the environment outside the receiving cavity, and wherein the PCBA is electrically connected to the hermetically-sealed electrical interconnection features inside the receiving cavity.

11. The integrated electronics package of claim 10, further comprising:
a plurality of heat sink elements formed in the upper and lower portions and extending from the peripheral shape of the body in a direction outwardly from a center of the body, wherein a first thermal conductive path is formed between a first interior surface of the receiving cavity and the plurality of heat sink elements formed in the upper portion, and wherein a second thermal conductive path is formed between an opposite second interior surface of the receiving cavity and the plurality of heat sink elements formed in the lower portion.

12. The integrated electronics package of claim 11, wherein a first thermal interface material is disposed between the first interior surface and a first heat generating element of the PCBA.

13. The integrated electronics package of claim 12, wherein a second thermal interface material is disposed between the second interior surface and a second heat generating element of the PCBA, wherein the first heat generating element of the PCBA is disposed on a first side of a substrate of the PCBA, and wherein the second heat generating element of the PCBA is disposed on an opposite second side of the substrate of the PCBA.

14. The integrated electronics package of claim 13, wherein the body, the receiving cavity, and the controlled bend features are integrally formed from a single extruded material.

15. The integrated electronics package of claim 13, wherein the controlled bend feature disposed in the upper portion of the peripheral shape includes a first set of flexures running the length of the body, and wherein the controlled bend feature disposed in the lower portion of the peripheral shape includes a second set of flexures running the length of the body.

16. The integrated electronics package of claim 15, wherein each of the first set of flexures is disposed at a non-zero angle relative to the first interior surface, and wherein each of the second set of flexures is disposed at a non-zero angle relative to the second interior surface.

17. The integrated electronics package of claim 14, further comprising:
a set of printed circuit board (PCB) channels running the length of the body, wherein the PCBA is at least partially captured in the PCB channels.

18. The integrated electronics package of claim 17, wherein the environment surrounding the PCBA inside the receiving cavity is filled with a potting material.

19. A method of assembling an integrated electronics package, comprising:
providing an electronics package, comprising:
a body having a peripheral shape including a first side and an opposite second side, and an upper portion and a lower portion disposed between the first and second sides, the peripheral shape extending along a length, the body including a first end surface disposed at a first end of the length and a second end surface disposed at a second end of the length;

a receiving cavity disposed inside the peripheral shape between the first and second sides and the upper and lower portions, the receiving cavity passing through the body from the first end surface to the second end surface; and a controlled bend feature disposed in the upper and lower portions of the peripheral shape of the body, wherein the controlled bend feature includes an elastically flexible region of material shaped to direct forces applied to the first and/or second sides along the upper and lower portions and in a direction outwardly from a center of the receiving cavity;

aligning a printed circuit board assembly (PCBA) with the receiving cavity of the body;

applying a compressive force to the first and/or second side of the body, wherein the compressive force flexes the controlled bend features and moves the upper portion and lower portion in opposite directions outwardly from the center of the receiving cavity providing a PCBA clearance height inside the receiving cavity;

inserting the PCBA into the receiving cavity having the PCBA clearance height, while the compressive force is maintained, wherein the PCBA is positioned between the first and second ends of the body;

releasing the compressive force applied, wherein upon releasing the compressive force applied the controlled bend features return to an unflexed state moving the upper portion and lower portion in a direction toward the center of the receiving cavity providing a reduced PCBA clearance height clamping the PCBA inside the receiving cavity;

attaching a first endplate to the first end of the body; and
attaching a second endplate to the second end of the body, wherein attachment of the first and second endplates isolate an environment surrounding the PCBA inside the receiving cavity from an environment outside the receiving cavity.

20. The method of claim 19, wherein prior to attaching the second endplate, the method further comprises:

inserting a potting material into the environment surrounding the PCBA inside the receiving cavity providing a mechanical connection between electronic components on the PCBA and interior surfaces of the receiving cavity.

* * * * *